(12) United States Patent
Kinoshita

(10) Patent No.: US 10,269,952 B2
(45) Date of Patent: Apr. 23, 2019

(54) SEMICONDUCTOR DEVICE HAVING STEPS IN A TERMINATION REGION AND MANUFACTURING METHOD THEREOF

(71) Applicant: FUJI ELECTRIC CO., LTD., Kawasaki-shi, Kanagawa (JP)

(72) Inventor: Akimasa Kinoshita, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 27 days.

(21) Appl. No.: 15/791,895

(22) Filed: Oct. 24, 2017

(65) Prior Publication Data
US 2018/0138309 A1    May 17, 2018

(30) Foreign Application Priority Data

Nov. 16, 2016  (JP) ................................ 2016-223537

(51) Int. Cl.
| | | |
|---|---|---|
| *H01L 29/06* | (2006.01) | |
| *H01L 29/78* | (2006.01) | |
| *H01L 29/66* | (2006.01) | |
| *H01L 29/16* | (2006.01) | |

(52) U.S. Cl.
CPC ...... *H01L 29/7811* (2013.01); *H01L 29/0661* (2013.01); *H01L 29/1608* (2013.01); *H01L 29/66068* (2013.01); *H01L 29/7813* (2013.01)

(58) Field of Classification Search
CPC ............. H01L 29/7811; H01L 29/7802; H01L 29/0661; H01L 29/1608

See application file for complete search history.

(56) References Cited

U.S. PATENT DOCUMENTS

2006/0118812 A1    6/2006  Ohtsuka et al.
2016/0172437 A1*   6/2016  Masuda .............. H01L 29/0619
                                                     257/494

FOREIGN PATENT DOCUMENTS

| JP | 2006-165225 A | 6/2006 |
| JP | 2010-050147 A | 3/2010 |
| JP | 2012-195519 A | 10/2012 |

OTHER PUBLICATIONS

K. Shenai et al., "Optimum Semiconductors for High-Power Electronics", IEEE Transactions on Electron Devices, vol. 36, No. 9, pp. 1811-1823, Sep. 1989.
B. Jayant Baliga, "Silicon Carbide Power Devices", US, World Scientific Publishing Co. Pte. Ltd., pp. 60-63, Mar. 30, 2006.

* cited by examiner

*Primary Examiner* — Laura M Menz
*Assistant Examiner* — Candice Chan
(74) *Attorney, Agent, or Firm* — Rabin & Berdo, P.C.

(57) ABSTRACT

A semiconductor device includes an active region provided in an n$^+$-type silicon carbide substrate and through which main current flows, a termination region that surrounds a periphery of the active region, and a p-type silicon carbide layer provided on a front surface of the n$^+$-type silicon carbide substrate and extending into the termination region. A region of the p-type silicon carbide layer extending into the termination region includes one or more step portions that progressively reduce a thickness of the p-type silicon carbide layer as the p-type silicon carbide layer becomes farther outward from the active region.

8 Claims, 5 Drawing Sheets

SEMICONDUCTOR DEVICE HAVING STEPS IN A TERMINATION REGION AND MANUFACTURING METHOD THEREOF

CROSS REFERENCE TO RELATED APPLICATIONS

This application is based upon and claims the benefit of priority of the prior Japanese Patent Application No. 2016-223537, filed on Nov. 16, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Silicon (Si) is conventionally used as a constituent material of power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Nonetheless, there is a strong market demand for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, e.g., K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other semiconductor materials having a bandgap greater than silicon (hereinafter, referred to as "wide bandgap semiconductor"), such as gallium nitride (GaN). Thus, a high-voltage semiconductor device having low resistance can be achieved by using a wide bandgap semiconductor material (see, e.g., B. Jayant Baliga, "Silicon Carbide Power Devices", US, World Scientific Publishing Co., Mar. 30, 2006, p. 61).

In such high-voltage semiconductor devices, high voltage is applied not only to an active region in which an element structure is formed and through which current flows in the on-state but also to an edge termination region that surrounds the periphery of the active region to maintain the breakdown voltage. Therefore, electric field concentrates at the edge termination region. The breakdown voltage of a high-voltage semiconductor device is determined by the impurity concentration, the thickness, and the electric field strength of the semiconductor; and the breakdown tolerance determined by features specific to the semiconductor is equal over a range including the active region and the edge termination region. As a result, electric load exceeding the breakdown tolerance may be applied to the edge termination region due to the concentration of the electric field at the edge termination region, resulting in breakdown. The breakdown voltage of the high-voltage semiconductor device is limited by the breakdown tolerance of the edge termination region.

A device having a breakdown voltage structure such as a junction termination extension (JTE) structure or a field limiting ring (FLR) structure arranged in the edge termination region is known to have improved breakdown voltage in the high-voltage semiconductor device overall by mitigating or dispersing the electric field in the edge termination region (see, e.g., Japanese Laid-Open Patent Publication Nos. 2010-50147, 2006-165225, and 2012-195519).

The breakdown voltage structure of a conventional high-voltage semiconductor device will be described taking a MOSFET that includes a JTE structure as an example. FIG. 5 is a cross-sectional view of a structure of a conventional semiconductor device. The conventional semiconductor device depicted in FIG. 5 includes an active region 1020 and an edge termination region 1030 surrounding the periphery of the active region 1020, on a semiconductor base substrate including silicon carbide (hereinafter, referred to as "silicon carbide base substrate (a semiconductor chip)") 1040. The silicon carbide base substrate 1040 has an $n^-$-type semiconductor layer including silicon carbide (hereinafter, referred to as "$n^-$-type silicon carbide layer) 102 and a p-type semiconductor layer including silicon carbide (hereinafter, referred to as "p-type silicon carbide layer") 106 sequentially stacked on a front surface of an $n^+$-type supporting substrate including silicon carbide (hereinafter, referred to as "$n^+$-type silicon carbide substrate") 101.

In the active region 1020, a MOS gate (an insulated gate including a metal oxide film semiconductor) having a trench structure is provided on the front surface side of the silicon carbide base substrate 1040 (the surface on the side having the p-type silicon carbide layer 106). The p-type silicon carbide layer 106 is removed from the edge termination region 1030 entirely, and a step portion 1031 formed by lowering (recessing toward the drain) the edge termination region 1030 relative to the active region 1020 is formed on the front surface of the silicon carbide base substrate 1040, exposing the $n^-$-type silicon carbide layer 102 at a bottom 1031a of the step portion 1031. In the edge termination region 1030, a JTE structure 1032 is provided that has plural adjacent $p^-$-type low-concentration regions (in the present example, two regions including from an inner side, a $p^-$-type region and a $p^{--}$-type region respectively denoted by reference numerals "1032a" and "1032b"). The impurity concentration of each $p^-$-type low-concentration region is lower, the closer the $p^-$-type low-concentration region is arranged to an outer side (chip end side). An $n^+$-type semiconductor region 1033 functioning as a channel stopper is provided on the outer side (the chip end side) of the JTE structure 1032.

The p⁻-type low-concentration region (hereinafter, referred to as "first JTE region") 1032a and the p⁻⁻-type low-concentration region (hereinafter, referred to as "second JTE region") 1032b are selectively provided in the portion of the n⁻-type silicon carbide layer 102 exposed at the bottom 1031a of the step portion 1031. The first JTE region 1032a extends to the step portion 1031 and contacts a p⁺⁺-type contact region 108 provided in the p-type silicon carbide layer 106. The JTE structure 1032 constitutes the breakdown voltage structure. A drain electrode 1014 contacting a rear surface of the silicon carbide base substrate 1040 (a rear surface of the n⁺-type silicon carbide substrate 101) is provided. The conventional high-voltage semiconductor device includes a p⁺-type base region 103, an n-type region 105, an n⁺-type source region 107, the p⁺⁺-type contact region 108, a gate insulating film 109, a gate electrode 1010, an interlayer insulating film 1011, a source electrode 1012, a source electrode pad 1013, and a trench 1015.

In the MOSFET having the configuration depicted in FIG. 5, when voltage that is positive relative to that of the source electrode 1012 is applied to the drain electrode 1014 and voltage equal to or lower than a threshold voltage is applied to the gate electrode 1010, the pn-junction between a p-type base region 106a and the n-type region 105 is reversely biased. The reverse breakdown voltage of the active region 1020 is therefore secured and no current flows. The p-type base region 106a is a portion of the p-type silicon carbide layer 106 other than the n⁺-type source region 107 and the p⁺⁺-type contact region 108.

On the other hand, when voltage equal to or higher than the threshold voltage is applied to the gate electrode 1010, an n-type inversion layer (a channel) is formed in a surface layer of a portion of the p-type base region 106a facing the gate electrode 1010. As a result, current flows along a path of the n⁺-type silicon carbide substrate 101, the n⁻-type silicon carbide layer 102, the n-type region 105, the surface inversion layer of the p-type base region 106a, and the n⁺-type source region 107. Commonly known switching operation of the MOSFET may be executed by controlling the gate voltage as described.

In the MOSFET having the configuration depicted in FIG. 5, when voltage is applied, a depletion layer spreads from a pn-junction between the p-type base region 106a and an n⁻-type drift layer toward the outer side and spreads in both the first and the second JTE regions 1032a and 1032b. The n⁻-type drift layer is a portion of the n⁻-type silicon carbide layer 102 other than the p⁺-type base region 103 and the first and the second JTE regions 1032a and 1032b. The breakdown voltage of the edge termination region is secured by the pn-junction between the n⁻-type drift layer and the first and the second JTE regions 1032a and 1032b.

The first and the second JTE regions 1032a and 1032b of the MOSFET having the configuration depicted in FIG. 5 are formed as follows. A resist mask not depicted and having a portion thereof opened corresponding to a formation region of the first JTE region 1032a is formed on the front surface of the silicon carbide base substrate 1040 by photolithography and etching. This resist mask is used as a mask to ion-implant a p-type impurity and thereby form the first JTE region 1032a.

After removing the resist mask used in the formation of the first JTE region 1032a, a resist mask not depicted and having a portion thereof opened corresponding to a formation region of the second JTE region 1032b is formed on the front surface of the silicon carbide base substrate 1040. This resist mask is used as a mask to ion implant a p-type impurity whose impurity concentration is lower than that of the p-type impurity used in the formation of the first JTE region 1032a, whereby the second JTE region 1032b is formed adjacent to the outer side of the first JTE region 1032a.

SUMMARY OF THE INVENTION

According to one embodiment of the invention, a semiconductor device includes an active region through which main current flows, the active region being provided on a semiconductor substrate of a first conductivity type containing a semiconductor material whose bandgap is wider than that of silicon; a termination region surrounding a periphery of the active region; and a semiconductor layer of a second conductivity type provided on a front surface of the semiconductor substrate, extending from the active region into the termination region, the semiconductor layer containing a semiconductor material whose bandgap is wider than that of silicon. A region of the semiconductor layer extended into the termination region includes one or more step portions reducing a thickness of the semiconductor layer as the semiconductor layer becomes farther outward from the active region.

In the embodiment, the termination region includes plural semiconductor regions of the second conductivity type arranged separately from each other at positions facing the region of the semiconductor layer where the thickness is reduced by the one or more step portions, the plural semiconductor regions concentrically surrounding the periphery of the active region and containing a semiconductor material whose bandgap is wider than that of silicon.

According to another embodiment of the invention, a method of manufacturing a semiconductor device includes forming an active region through which a main current flows, the active region being formed on a semiconductor substrate of a first conductivity type containing a semiconductor material whose bandgap is wider than that of silicon; forming a termination region surrounding a periphery of the active region; forming a semiconductor layer of a second conductivity type, the semiconductor layer being formed on a front surface of the semiconductor substrate so as to extend from the active region into the termination region, the semiconductor layer containing a semiconductor whose bandgap is wider than that of silicon; and forming one or more step portions in a region of the semiconductor layer extended into the termination region, the one or more step portions reducing a thickness of the semiconductor layer as the semiconductor layer becomes farther outward from the active region.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
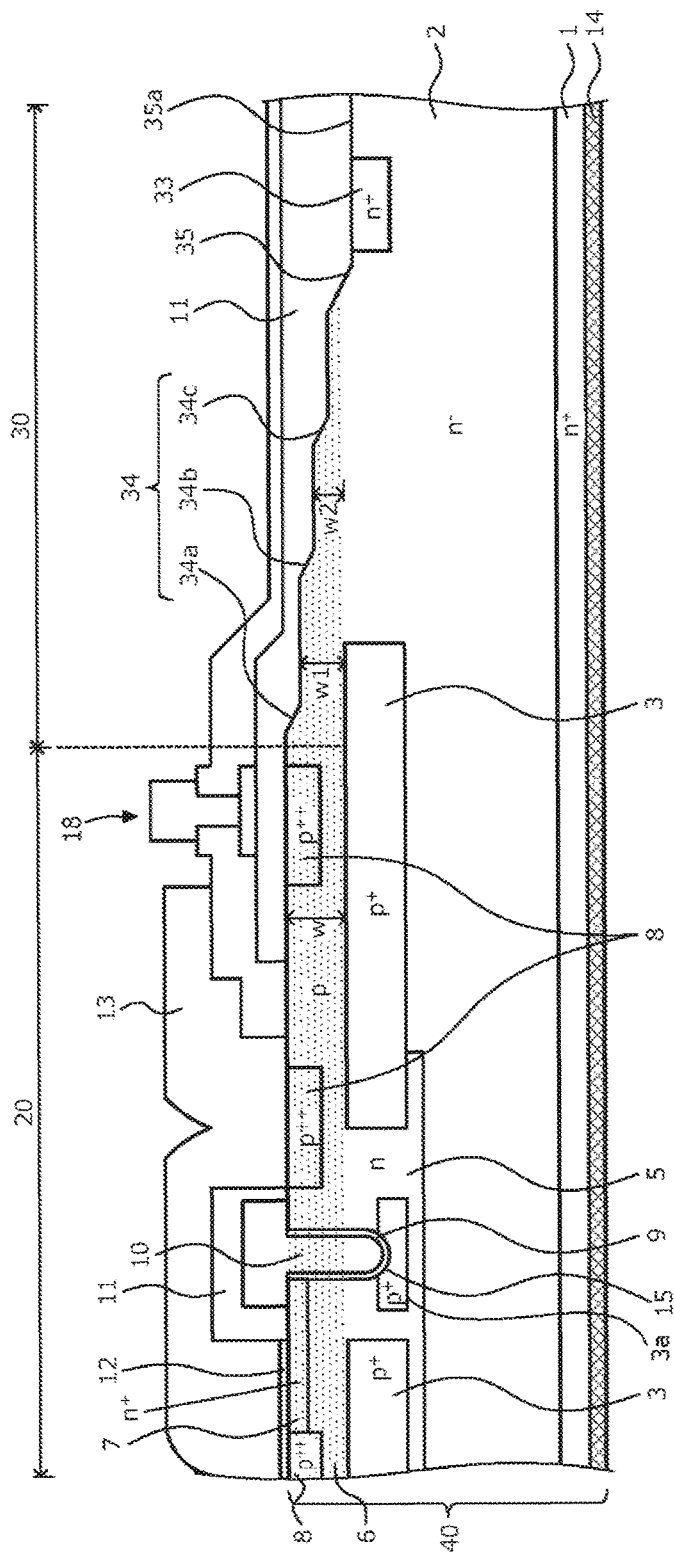
FIG. 1 is a cross-sectional view of a structure of a semiconductor device according to a first embodiment.

With the MOSFET of the conventional technique, to form the JTE structure including the p-type regions whose impurity concentrations become lower in a stepwise manner, plural ion implantation sessions are executed employing impurity concentrations that differ from each other. However, since the execution of the ion implantation sessions takes time, formation of the JTE structure requires a lot of time.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to the present invention is configured using a wide bandgap semiconductor. In a first embodiment, a semiconductor device manufactured using, for example, silicon carbide (SiC) as the wide bandgap semiconductor, i.e., a silicon carbide semiconductor device will be described taking a MOSFET as an example. However, the invention is not limited to silicon carbide, and embodiments encompass any other wide bandgap semiconductor. FIG. 1 is a cross-sectional view of a structure of the semiconductor device according to the first embodiment.

As depicted in FIG. 1, the semiconductor device according to the first embodiment includes on a semiconductor base substrate including silicon carbide (hereinafter, referred to as "silicon carbide base substrate (semiconductor substrate (a semiconductor chip))") 40, an active region 20 and an edge termination region 30 surrounding a periphery of the active region 20. The active region 20 is a region through which current flows in the on-state. The edge termination region 30 is a region that mitigates the electric field on a base-substrate front surface side of a drift region to maintain the breakdown voltage. The active region is defined by semiconductor elements formed to allow current to flow.

The silicon carbide base substrate 40 has an n⁻-type semiconductor layer 2 including silicon carbide (an n⁻-type silicon carbide layer) and a p-type semiconductor layer 6 including silicon carbide (a p-type silicon carbide layer) sequentially stacked on the front surface of an n⁺-type supporting substrate 1 including silicon carbide (an n⁺-type silicon carbide substrate). The n⁺-type silicon carbide substrate 1 functions as a drain region. In the active region 20, a p⁺-type base region 3 and an n-type region 5 are selectively provided in the surface layer on the side opposite to the side of the n⁺-type silicon carbide substrate 1, of the n⁻-type silicon carbide layer 2 (the side of the front surface of the base substrate). In the edge termination region 30, an n⁺-type semiconductor region 33 functioning as a channel stopper is selectively provided in a surface layer on a first side of the n⁻-type silicon carbide layer 2 opposite a second side of the n⁻-type silicon carbide layer 2 facing the n⁺-type silicon carbide substrate 1. The n⁺-type semiconductor region 33 is provided in a bottom portion 35a of a step portion 35 formed by reducing the thickness of the n⁻-type silicon carbide layer 2 by the step portion 35. The p⁺-type base region 3 that is outermost (on the chip end side) extends from inside the active region 20 into the edge termination region 30. A portion of the n⁻-type silicon carbide layer 2 other than the p⁺-type base region 3 is the drift region. The n-type region 5 is a high concentration n-type drift layer whose impurity concentration is lower than that of the n⁺-type silicon carbide substrate 1 and higher than that of the n⁻-type silicon carbide layer 2.

The p-type silicon carbide layer 6 is provided in the surface of the first side of the n⁻-type silicon carbide layer 2. The impurity concentration of the p-type silicon carbide layer 6 is lower than the impurity concentration of the p⁺-type base regions 3. An n⁺-type source region (a second semiconductor region) 7 and a p⁺⁺-type contact region 8 are each selectively provided in the p-type silicon carbide layer 6.

In a portion of the active region 20, the p-type silicon carbide layer 6 is provided to cover the p⁺-type base regions 3 and the n-type region 5. The p-type silicon carbide layer 6 extends into the edge termination region 30 and, in the edge termination region 30, is provided to cover the p⁺-type base region 3 and the n⁻-type silicon carbide layer 2 up to the step portion 35.

In the edge termination region 30, the p-type silicon carbide layer 6 includes one or more step portions 34. In the example depicted in FIG. 1, the p-type silicon carbide layer 6 includes three step portions 34a, 34b, and 34c. The thickness of the p-type silicon carbide layer 6 measured from the surface of the p⁺-type base regions 3 or the n⁻-type silicon carbide layer 2 decreases in a stepwise manner due to the step portions 34. As a result, the p-type silicon carbide layer 6 constitutes the JTE structure whose effective impurity concentration decreases in a direction away from the active region 20. For example, the thickness w of the p-type silicon carbide layer 6 in the portion of the active region 20 is reduced to be a thickness w1 (<w) due to the step portion 34a. Similarly, the thickness w1 of the p-type silicon carbide layer 6 is reduced to be a thickness w2 (<w1) due to the step portion 34b. Although not depicted in FIG. 1, the thickness w2 of the p-type silicon carbide layer 6 is reduced due to the step portion 34c.

When the p-type silicon carbide layer 6 includes only one step portion 34, the thickness of the p-type silicon carbide layer 6 may be reduced to be a half thereof by the step portion 34. The step portion 34 may be arranged in an annular planar layout surrounding the periphery of the active region 20.

A trench structure is formed in a portion of the active region 20 on the front surface side of the silicon carbide base substrate 40. For example, a trench 15 penetrates the n⁺-type source region 7 and the p-type silicon carbide layer 6 from the surface on a first side of the p-type silicon carbide layer 6 (the front surface side of the silicon carbide base substrate 40) opposite a second side of the p-type silicon carbide layer 6 facing toward the n⁺-type silicon carbide substrate 1, the trench 15 reaching the n-type region 5 and a p⁺-type base region 3a. Along an inner wall of the trench 15, a gate insulating film 9 is formed on a bottom portion and side walls of the trench 15 and a gate electrode 10 is formed on the gate insulating film 9 in the trench 15. The gate electrode 19 is insulated from the n-type region 5, the p⁺-type base region 3, and the p-type silicon carbide layer 6 by the gate insulating film 9. A portion of the gate electrode 10 may protrude toward a source electrode pad 13, from a position above the trench 15 (a side facing the source electrode pad 13).

An interlayer insulating film 11 is provided on the entire front surface side of the silicon carbide base substrate 40 so as to cover the gate electrode 10 that is embedded in the trench 15. A source electrode 12 contacts the n⁺-type source region 7 and the p⁺⁺-type contact region 8 through a contact hole opened in the interlayer insulating film 11. The source electrode 12 is electrically insulated from the gate electrode 10 by the interlayer insulating film 11. The source electrode pad 13 is provided on the source electrode 12. A drain electrode 14 is provided on a rear surface of the silicon carbide base substrate 40 (a rear surface of the n⁺-type silicon carbide substrate 1).

FIG. 1 depicts only one trench MOS structure while more MOS gate (insulated gate including a metal oxide film semiconductor) structures each having the trench gate structure may be arranged in parallel. While one MOS structure is shown as a semiconductor element in FIG. 1, other semiconductor elements, such as the semiconductor element 18, including contact electrodes and insulating layers, may also be formed in the active region 20. In one embodiment, an interlayer insulating film 11 of one or more semiconductor elements 18 extends from the active region 20 into the termination region 30 over the one or more step portions 34. In one embodiment, an upper surface of the interlayer insulating film 11 does not have a shape corresponding to the steps of the one or more step portions 34. For example, a portion of the interlayer insulating film 11 over the one or more step portions 34 may have a flat or planar shape.

Figure 2:
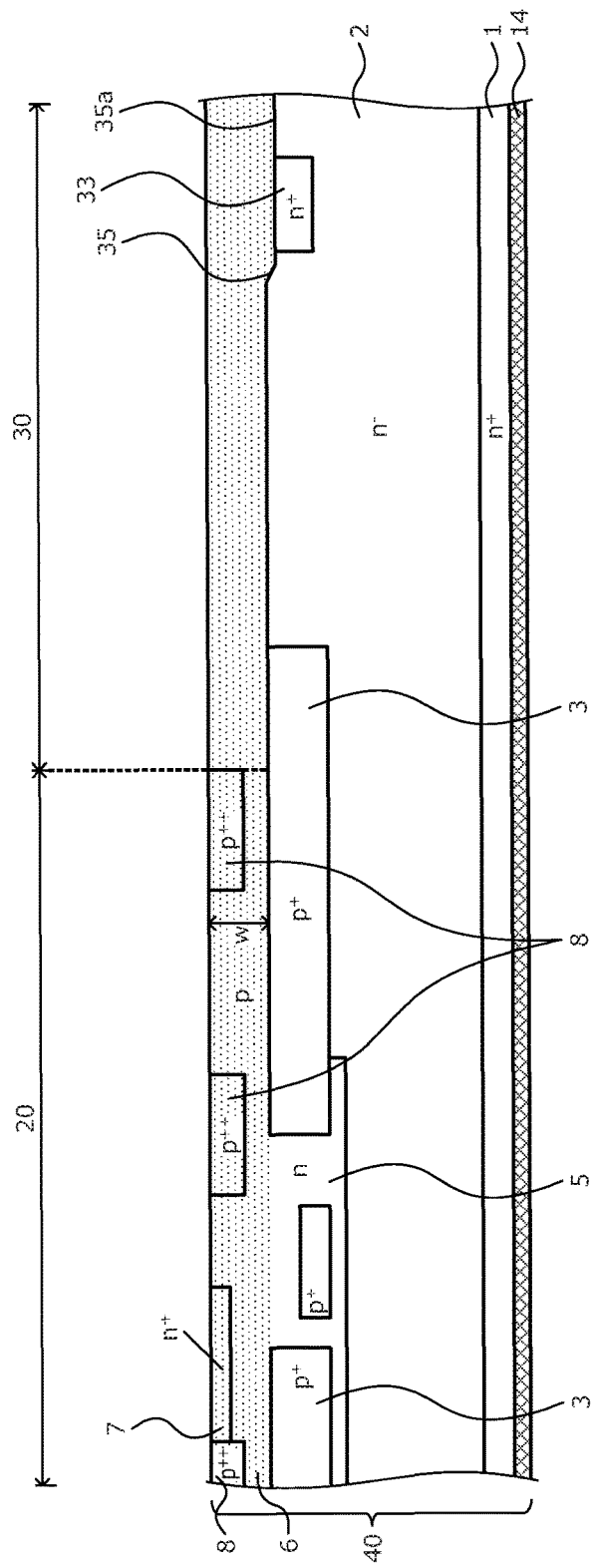
FIGS. 2 and 3 are cross-sectional views of the semiconductor device during manufacture.
Figure 3:
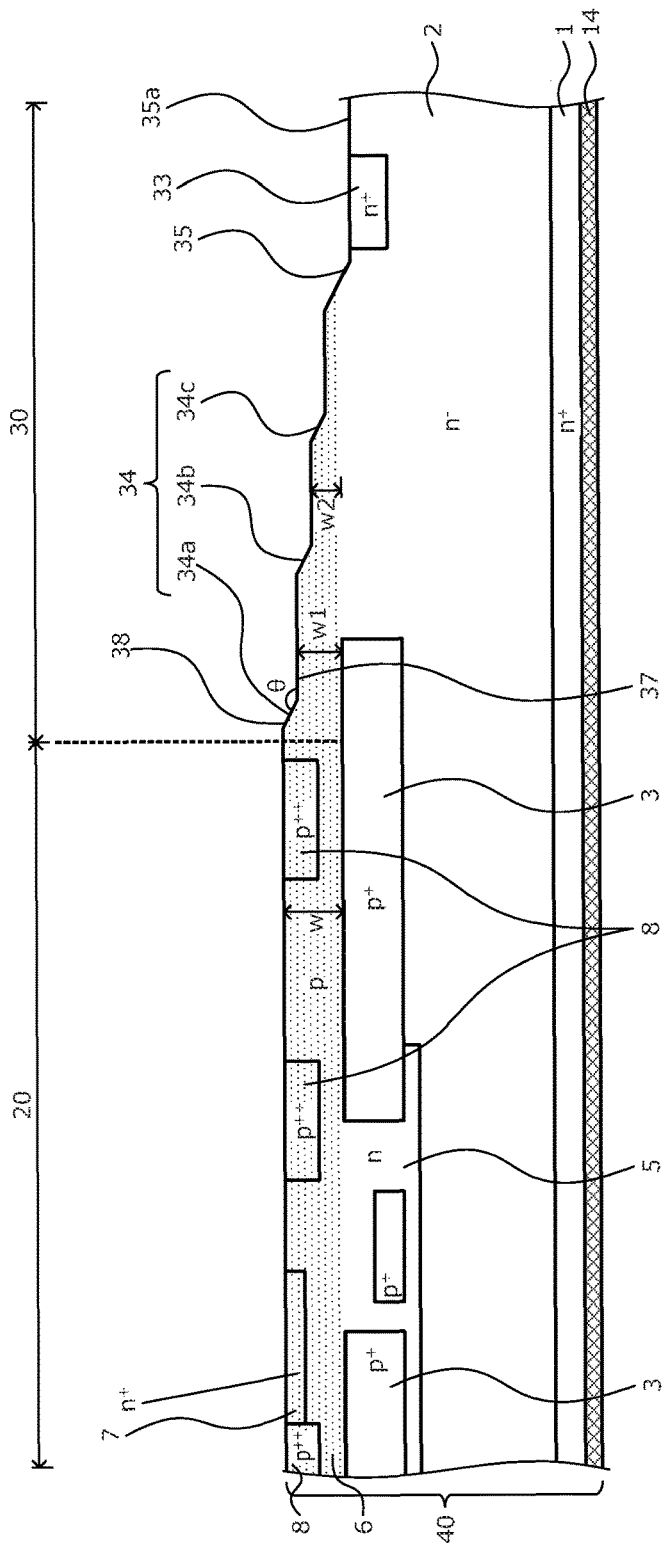

A method of manufacturing a semiconductor device according to the first embodiment will be described taking, as an example, a case where, for example, a 1200V MOSFET is manufactured. FIGS. 2 and 3 are cross-sectional views of the semiconductor device according to the embodiment during manufacture. The n⁺-type silicon carbide substrate (a semiconductor wafer) 1 is prepared that includes single-crystal silicon carbide doped with an n-type impurity (a dopant) such as nitrogen (N) to establish an impurity concentration of, for example, $2.0 \times 10^{19}/cm^3$. The front surface of the n⁺-type silicon carbide substrate 1 may be a (0001) surface that has an off-angle of, for example, about 4 degrees in a <11-20> direction. The n⁻-type silicon carbide layer 2 doped with an n-type impurity such as nitrogen to establish an impurity concentration of, for example, $1.0 \times 10^{16}/cm^3$ is formed on the front surface of the n⁺-type silicon carbide substrate 1 by epitaxial growth to have a thickness of, for example, 10 μm.

The n-type region 5 is selectively formed in the surface layer of the n⁻-type silicon carbide layer 2 by photolithography and ion implantation. In this ion implantation, an n-type impurity (a dopant) such as nitrogen may be implanted to establish a concentration of, for example, $1 \times 10^{17}/cm^3$.

The p⁺-type base region 3 is selectively formed in the surface layer of the n⁻-type silicon carbide layer 2 by photolithography and the ion implantation. The p⁺-type base region 3 that is outermost is formed to extend to the edge termination region 30. In this ion implantation, a p-type impurity (a dopant) such as, for example, aluminum (Al) may be implanted to establish the impurity concentration of the p⁺-type base region 3 to be $5.0 \times 10^{18}/cm^3$.

The p⁺-type silicon carbide layer 6 doped with a p-type impurity such as aluminum to establish an impurity concentration of, for example, $2.0 \times 10^{17}/cm^3$ is epitaxial-grown to have a thickness of, for example, 1.3 μm on the surface of the n⁻-type silicon carbide layer 2.

The silicon carbide base substrate 40 having the n⁻-type silicon carbide layer 2 and the p-type silicon carbide layer 6 sequentially stacked on the front surface of the n⁺-type silicon carbide substrate 1 is manufactured by the processes executed so far. A process including formation of a mask for ion implantation by photolithography and etching, ion implantation using the mask for the ion implantation, and removal of the mask for the ion implantation as one set, is repeatedly executed with different ion implantation conditions to form the n⁺-type source region 7 and the p⁺⁺-type contact region 8 in the surface layer of the p-type silicon carbide layer 6. The state established so far is depicted in FIG. 2.

The step portion 34a is formed at a depth of, for example, 0.3 μm in the surface of the p-type silicon carbide layer 6 in the edge termination region 30 by photolithography and etching to reduce the thickness of the p-type silicon carbide layer 6 in the edge termination region 30. At this time, a slope may be imparted to a side wall 38 of the step portion 34a such that an angle θ of the side wall 38 and a bottom 37 is an obtuse angle, by forming the step portion 34a by, for example, isotropic etching. The step portions 34b and 34c are similarly formed, and the thickness of the p-type silicon carbide layer 6 is thereby reduced in the stepwise manner in the edge termination region 30.

The step portion 35 is formed to be at a depth of, for example, 1.5 μm from the surface of the p-type silicon carbide layer 6 in the surface of the p-type silicon carbide layer 6 in the edge termination region 30 by photolithography and etching, and a portion of each of the p-type silicon carbide layer 6 and the n⁻-type silicon carbide layer 2 is removed to expose the n⁻-type silicon carbide layer 2. The n-type region 33 is selectively formed by photolithography and ion implantation. In this ion implantation, an n-type impurity (a dopant) such as phosphorus may be implanted to establish a concentration of, for example, $3 \times 10^{20}/cm^3$. The state established so far is depicted in FIG. 3.

Heat treatment (annealing) is executed to activate, for example, the p⁺-type base region 3, the n⁺-type source region 7, the p⁺⁺-type contact region 8, and the n⁺-type semiconductor region 33. The temperature of the heat treatment may be, for example, about 1700 degrees C. The time period of the heat treatment may be, for example, about 2 minutes. The ion-implanted regions may be activated collectively in one heat treatment session as above, or heat treatment for activation may be executed each time ion implantation is executed.

The trench 15 penetrating the n⁺-type source region 7 and the p-type silicon carbide layer 6 to reach the n-type region 5 is formed by photolithography and etching on the surface of the p-type silicon carbide layer 6 (i.e., the surfaces of the n⁺-type source region 7 and the p⁺⁺-type contact region 8). The bottom portion of the trench 15 reaches the p⁺-type base region 3.

The gate insulating film 9 is formed along the surfaces of the n⁺-type source region 7 and the p⁺⁺-type contact region 8, and the bottom portion and the side walls of the trench 15. The gate insulating film 9 may be formed by thermal oxidation in heat treatment executed in an oxygen atmosphere and at a temperature of about 1000 degrees C. The gate insulating film 9 may be formed using a method of deposition by a chemical reaction such as high temperature oxidation (HTO).

A polysilicon layer doped with, for example, phosphorus atoms (P) is formed on the gate insulating film 9. The polysilicon layer is formed to fill the trench 15. The gate electrode 10 is formed by patterning the polysilicon layer so that the polysilicon layer remains in the trench 15. A portion of the gate electrode 10 may protrude from a position above the trench 15 (on the side facing the source electrode pad 13) toward the source electrode pad 13.

The interlayer insulating film 11 is formed by forming a film of, for example, phosphosilicate glass (PSG) having a thickness of about 1 μm to cover the gate insulating film 9 and the gate electrode 10. The contact hole is formed by patterning the interlayer insulating film 11 and the gate insulating film 9 to selectively remove the interlayer insulating film 11 and the gate insulating film 9 to expose the $n^+$-type source region 7 and the $p^{++}$-type contact region 8. Heat treatment (reflow) is thereafter executed to planarize the interlayer insulating film 11.

A conductive film to be the source electrode 12 is formed in the contact hole and on the interlayer insulating film 11. The conductive film is selectively removed so that, for example, the source electrode 12 remains in only the contact hole.

The drain electrode 14 including, for example, a nickel film is formed on the rear surface of the silicon carbide base substrate 40 (the rear surface of the $n^+$-type silicon carbide substrate 1). Heat treatment is thereafter executed at a temperature of, for example, about 970 degrees C. to form an ohmic junction between the $n^+$-type silicon carbide substrate 1 and the drain electrode 14.

For example, an aluminum film is formed by, for example, a sputtering method to have a thickness of, for example, about 5 μm and to cover the source electrode 12 and the interlayer insulating film 11. The aluminum film is thereafter selectively removed so that the aluminum film covering the active region 20 remains. As a result, the source electrode pad 13 is formed.

A drain electrode pad is formed by sequentially stacking, for example, titanium (Ti), nickel (Ni), and gold (Au) on the surface of the drain electrode 14. In this manner, the semiconductor device depicted in FIG. 1 is completed.

As described, according to the first embodiment, the JTE structure is formed by the p-type silicon carbide layer whose thickness is reduced by the step portion the closer the p-type silicon carbide layer is arranged to the outer side and as a result, the JTE structure may be formed by photolithography and etching. The photolithography and the etching may be executed in a time period shorter than the time period necessary for ion implantation. As a result, ion implantation processes to form the JTE structure may be avoided. The time period to form the JTE structure may be reduced and the time and the cost to manufacture the semiconductor device may be reduced.

Because the thickness of the p-type silicon carbide layer decreases the closer the p-type silicon carbide layer is arranged to the outer side, the impurity included therein also decreases the closer the p-type silicon carbide layer is arranged to the outer side. Similar to the conventional JTE structure, the p-type silicon carbide layer may mitigate or disperse the electric field applied to the edge termination region.

Figure 4:
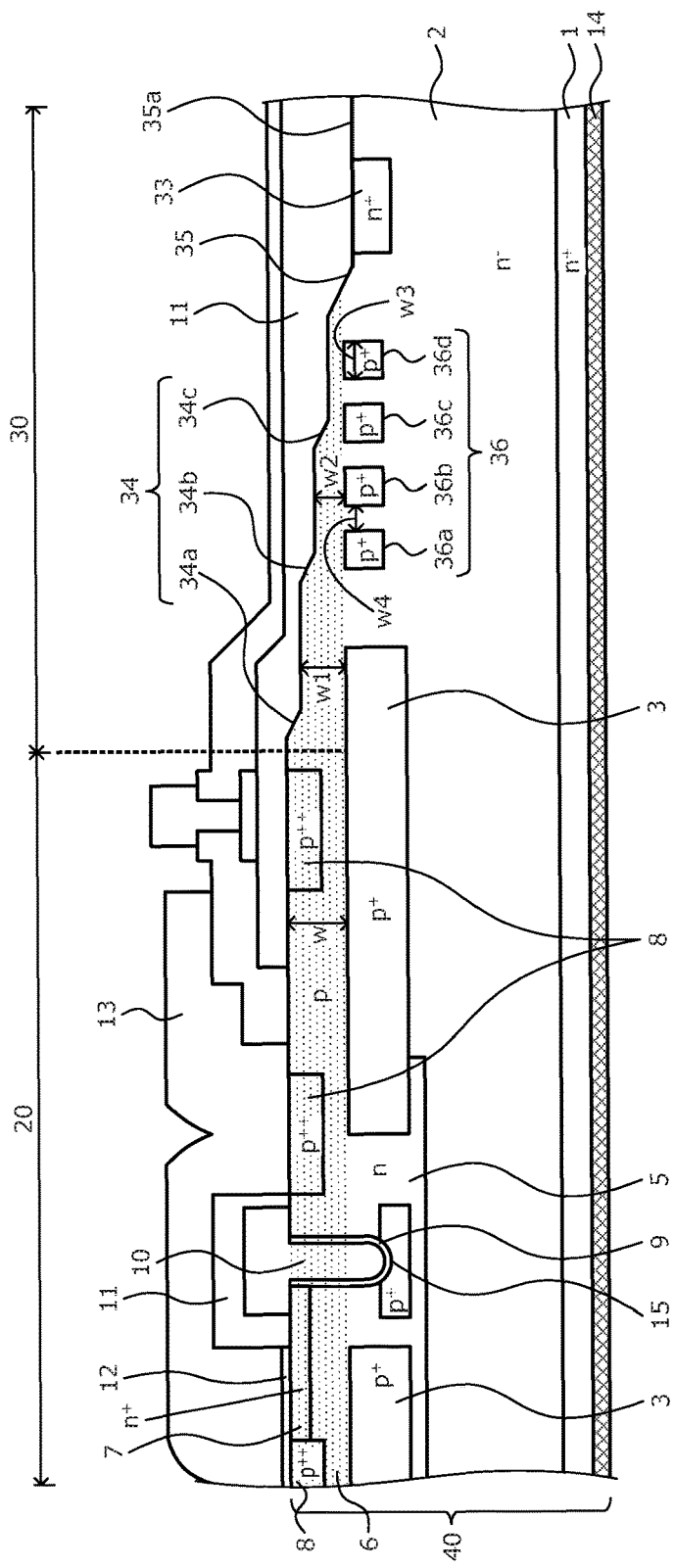
FIG. 4 is a cross-sectional view of a structure of a semiconductor device according to a second embodiment.
Figure 5:
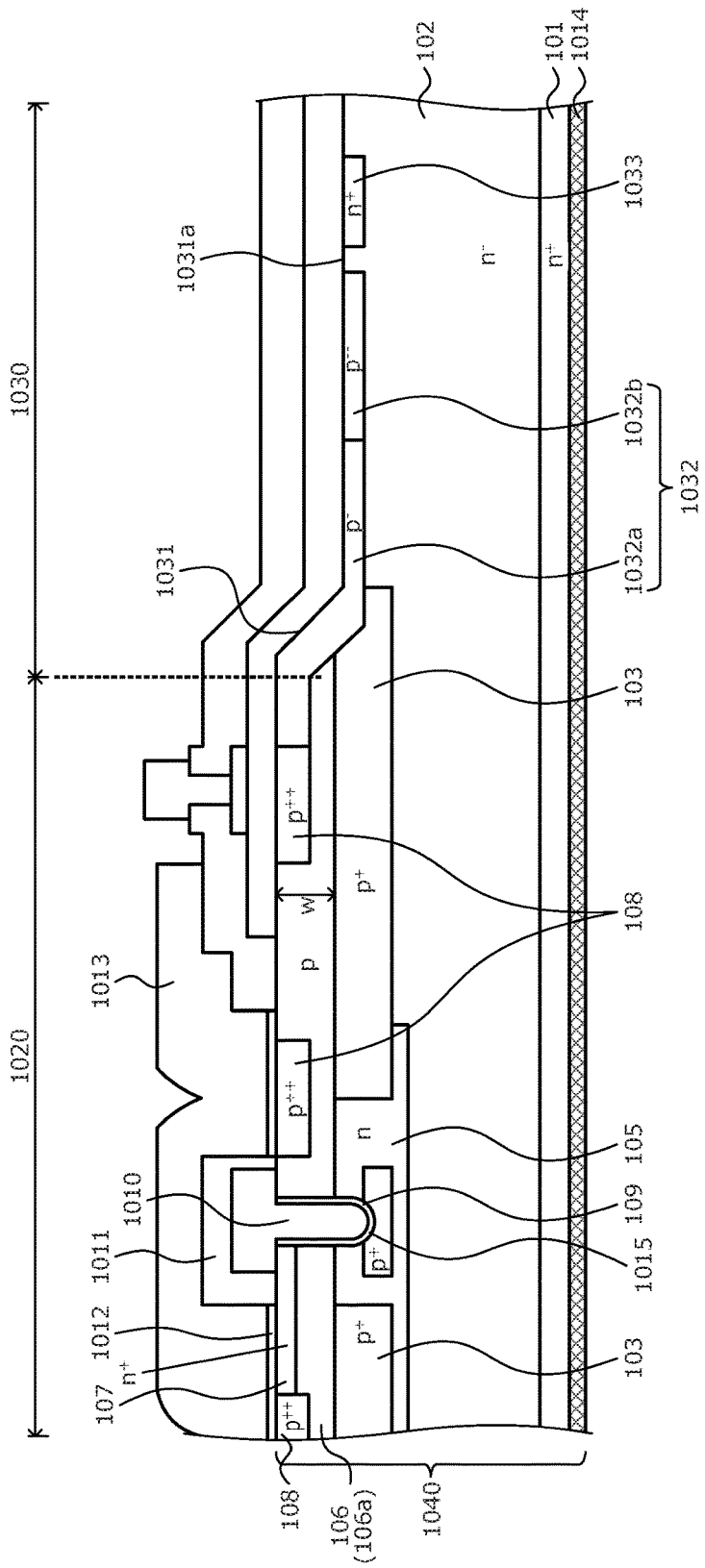
FIG. 5 is a cross-sectional view of a structure of a conventional semiconductor device.

FIG. 4 is a cross-sectional view of a structure of a semiconductor device according to a second embodiment of the present invention. As depicted in FIG. 4, the silicon carbide semiconductor device according to the second embodiment has an FLR structure including plural p-type semiconductor regions 36 that are separate from the $p^+$-type base region 3 and also from each other, provided on the surface of the $n^-$-type silicon carbide layer 2 in the edge termination region 30. The p-type semiconductor regions 36 are provided concentrically surrounding the periphery of the active region 20, in the surface of the $n^-$-type silicon carbide layer 2 facing the portion of the p-type silicon carbide layer 6 where the thickness of the p-type silicon carbide layer 6 is reduced by the step portion 34.

For example, the plural p-type semiconductor regions 36 may be arranged at equal intervals and the impurity concentrations thereof may be lower the closer the p-type semiconductor region 36 is arranged to the outer side. As a result, the impurity amounts of the plural p-type semiconductor regions 36 decrease the farther outward the p-type semiconductor region 36 is arranged from the active region 20 and the p-type semiconductor regions 36 may mitigate or disperse the electric field applied to the edge termination region. In the example depicted in FIG. 4, four p-type semiconductor regions 36a, 36b, 36c, and 36d are provided.

For example, for the plural p-type semiconductor regions 36, intervals w4 between the p-type semiconductor regions 36 may be set to be equal to each other and a width w3 of the p-type semiconductor regions 36 may decrease the closer the p-type semiconductor region 36 is arranged to the outer side. As a result, the impurity amount decreases the farther outward the p-type semiconductor region 36 is arranged from the active region 20 and the p-type semiconductor regions 36 may mitigate or disperse the electric field applied to the edge termination region. For example, the width of the p-type semiconductor region 36a is larger than the width of the p-type semiconductor region 36b. The width of the p-type semiconductor region 36b is larger than the width of the p-type semiconductor region 36c, and similarly for the p-type semiconductor region 36d, where the width of the p-type semiconductor region 36d is the smallest.

For example, for the plural p-type semiconductor regions 36, the width w3 of each of the p-type semiconductor regions 36 may be set to be equal to each other and the intervals w4 between the p-type semiconductor regions 36 may increase the closer the p-type semiconductor region 36 is arranged to the outer side. As a result, the impurity amounts decrease the farther outward the p-type semiconductor region 36 is arranged from the active region 20 and the p-type semiconductor regions 36 may mitigate or disperse the electric field applied to the edge termination region. For example, the interval between the p-type semiconductor region 36a and the p-type semiconductor region 36b is smaller than the interval between the p-type semiconductor region 36b and the p-type semiconductor region 36c. The interval between the p-type semiconductor region 36b and the p-type semiconductor region 36c is smaller than the interval between the p-type semiconductor region 36c and the p-type semiconductor region 36d.

The other configurations of the silicon carbide semiconductor device according to the second embodiment are similar to the configurations of the silicon carbide semiconductor device according to the first embodiment and will not again be described.

A method of manufacturing a semiconductor device according to the second embodiment will be described. The processes from the process of forming the $n^-$-type silicon carbide layer 2 to the process of selectively forming the $n^+$-type base region 3 are sequentially executed similar to the first embodiment.

The p-type semiconductor regions 36 are selectively formed in the surface layer of the n⁻-type silicon carbide layer 2 in the edge termination region 30 by photolithography and ion implantation. The plural p-type semiconductor regions 36 whose impurity concentrations differ from each other may be formed by repeatedly executing a process including formation of a mask for ion implantation by photolithography and etching, ion implantation using the mask for the ion implantation, and removal of the mask for the ion implantation as one set, each set using different ion implantation conditions.

Similar to the first embodiment, the process of forming the p-type silicon carbide layer 6 by epitaxial growth and the processes executed thereafter are sequentially executed and the MOSFET depicted in FIG. 4 is thereby completed.

As described, according to the semiconductor device and the method of manufacturing a semiconductor device of the second embodiment, effect similar to those of the semiconductor device and the method of manufacturing a semiconductor device according to the first embodiment may be achieved.

In the second embodiment, the depletion layer spreads from the pn-junction of the p⁺-type base region and the p-type base region, and the n-type drift layer to the outer side of the JTE structure and the FLR structure due to JET structure and the FLR structure provided on the surface of the n⁻-type silicon carbide layer. As a result, the electric field applied to the pn-junction is mitigated and the breakdown voltage may be secured.

In many cases, the activation rate of the JTE structure provided in the p-type silicon carbide layer varies significantly by a minor variations in the conditions for the activation by heat treatment (annealing) and for the ion implantation whereby the impurity concentrations of the p-type silicon carbide layers significantly vary, causing the breakdown voltage to be a low value different from that intended. In the second embodiment, the breakdown voltage may be secured even in this case by providing the FLR structure on the surface of the n⁻-type silicon carbide layer in addition to the JTE structure.

In the embodiments, although the step portions in the p-type silicon carbide layer are formed by photolithography and etching, the step portions may be formed by photolithography and ion implantation. For example, the step portions may be formed by inverting the conductivity type of a portion of the p-type silicon carbide layer by executing plural ion implantation sessions of differing implantation energies after the p-type silicon carbide layer is formed by epitaxial growth.

In the embodiments, although the vertical MOSFETs each including the trench structure, depicted in FIG. 1 and FIG. 4 have been described, the present invention is applicable to a vertical MOSFET including a planar structure, a horizontal MOSFET, and the like. As to the vertical MOSFET including the trench structure, the p-type silicon carbide layer is thick because the trench is formed whereby the step portions are easily formed. As a result, the present invention is especially effective for vertical MOSFETs including a trench structure.

Although the embodiments have been described in the above taking, as an example, a case where a first main surface of the silicon carbide substrate including silicon carbide is a (0001) surface and the MOS gate structure is configured on the (0001) surface, the present invention is not limited hereto and various changes may be made thereto such as the type of the wide bandgap semiconductor material used (e.g., gallium nitride (GaN)) and the plane direction of the substrate main surface. In the embodiments, although a first conductivity type is assumed to be an n-type and a second conductivity type is assumed to be a p-type, the present invention is similarly implemented when the first conductivity type is a p-type and the second conductivity type is an n-type.

The present invention enables the JTE structure to be formed by photolithography and etching by forming the JTE structure using the semiconductor layer of the second conductivity type and whose thickness decreases stepwise the closer the semiconductor layer is to the outer side. As a result, the ion implantation processes to form the JTE structure may be omitted. Therefore, the time consumed to form the JTE structure may be reduced and the time consumed to manufacture the semiconductor device may be reduced.

The thickness of the semiconductor layer of the second conductivity type decreases as the semiconductor layer becomes closer to the outer side, and the amounts of the impurity therein decrease as the semiconductor layer becomes closer to the outer side. Similar to the conventional JTE structure, the semiconductor layer of the second conductivity type may mitigate or disperse the electric field applied to the edge termination region.

According to the semiconductor device and the method of manufacturing a semiconductor device of the present invention, an effect is achieved in that the time period to form the JTE structure may be reduced.

As described, the semiconductor device and the method of manufacturing a semiconductor device according to the present invention are useful for semiconductor devices used as a switching device and are especially suitable for vertical MOSFETs that use a wide bandgap semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
a semiconductor substrate that has a bandgap that is wider than that of silicon, that includes a semiconductor element, an active region through which main current flows through the semiconductor element, and a termination region surrounding a periphery of the active region, and that is comprised of:
a first semiconductor layer of a first conductivity type that contains silicon carbide and that extends from the active region into the termination region; and
a second semiconductor layer of a second conductivity type that is provided on a front surface of the first semiconductor layer, extending from the active region into the termination region, that contains a semiconductor material having a bandgap that is wider than that of silicon and that includes, in the termination region, a plurality of step portions that reduce thickness of the second semiconductor layer stepwise to zero as the second semiconductor layer extends in an outward direction away from the active region,
wherein the second semiconductor layer in the active region has a first thickness, and the second semiconductor layer in the termination region includes a first step that reduces the thickness of the second semiconductor layer to a second thickness which is less than the first thickness, and a second step that is farther from the active region than the first step and that has a height that is greater than the second thickness.

2. The semiconductor device according to claim 1, wherein the plurality of step portions defines a plurality of semiconductor regions, each having a different thickness and each concentrically surrounding the periphery of the active region.

3. The semiconductor device according to claim 1, wherein the second step reduces the thickness of the second semiconductor layer to a third thickness which is less than the second thickness.

4. A method of manufacturing a semiconductor device, comprising:
   forming at least one semiconductor element in a semiconductor substrate of a first conductivity type and containing a semiconductor material having a bandgap wider than that of silicon to define an active region of the semiconductor substrate through which a main current flows and a termination region surrounding a periphery of the active region;
   forming in the semiconductor substrate a first semiconductor layer of a first conductivity type that contains silicon carbide and that extends from the active region into the termination region;
   forming a second semiconductor layer of a second conductivity type on a front surface of the first semiconductor layer extending from the active region into the termination region, the second semiconductor layer containing a semiconductor whose bandgap is wider than that of silicon; and
   forming a plurality of step portions in a region of the second semiconductor layer in the termination region, the a plurality of step portions being arranged to reduce thickness of the second semiconductor layer stepwise to zero as the second semiconductor layer extends in an outward direction away from the active region,
   wherein the second semiconductor layer in the active region has a first thickness, and the second semiconductor layer in the termination region includes a first step that reduces the thickness of the second semiconductor layer to a second thickness which is less than the first thickness, and a second step that is farther from the active region than the first step and that has a height that is greater than the second thickness.

5. A semiconductor device, comprising:
   a silicon carbide base substrate that has a bandgap that is wider than that of silicon, that includes a semiconductor element, an active region through which main current flows through the semiconductor element, and a termination region surrounding a periphery of the active region, and that is comprised of:
      a first semiconductor layer of a first conductivity type that contains silicon carbide and that extends from the active region into the termination region; and
      a second semiconductor layer of a second conductivity type that is provided on a front surface of the first semiconductor layer extending from the active region into the termination region, that contains a semiconductor material having a bandgap that is wider than that of silicon, and that includes, in the termination region, a plurality of step portions that reduce thickness of the second semiconductor layer stepwise to zero as the second semiconductor extends in an outward direction away from the active region; and
      an annular semiconductor region of a first conductivity type provided within the first semiconductor layer in an outer portion of the termination region where the termination region does not include the second semiconductor layer and having a dopant concentration that is greater than that of the of the first semiconductor layer so that the annular semiconductor region is an annular channel stopper region.

6. The semiconductor device according to claim 5, wherein the plurality of step portions defines a plurality of semiconductor regions, each having a different thickness and each concentrically surrounding the periphery of the active region.

7. The semiconductor device according to claim 5, wherein the second semiconductor layer extending from the active region has a first thickness, and the second semiconductor layer in the termination region includes a first step that reduces the thickness of the second semiconductor layer to a second thickness that is less than the first thickness, and a second step farther from the active region than the first step, the second step reduces the thickness of the second semiconductor layer to a third thickness which is less than the second thickness.

8. The semiconductor device according to claim 5, wherein the second semiconductor layer extending from the active region has a first thickness, and the second semiconductor layer in the termination region includes a first step that reduces the thickness of the semiconductor layer to a second thickness which is less than the first thickness, and a second step that is farther from the active region than the first step, the second step having a height that is greater than the second thickness, such that a portion of the termination region farther from the active region than the second step does not include the semiconductor layer.

* * * * *